United States Patent [19]
Sandfort

[11] 3,940,751
[45] Feb. 24, 1976

[54] MUTUALLY EXCLUSIVE PARALLEL-SIDED LOOPS

[75] Inventor: Robert M. Sandfort, St. Charles, Mo.

[73] Assignee: Monsanto Company, St. Louis, Mo.

[22] Filed: Mar. 27, 1974

[21] Appl. No.: 455,275

[52] U.S. Cl. .................... 340/174 TF; 340/174 SR
[51] Int. Cl.² .................. G11C 11/14; G11C 19/08
[58] Field of Search ................ 340/174 TF, 174 SR

[56] References Cited
UNITED STATES PATENTS

| | | | |
|---|---|---|---|
| 3,534,347 | 10/1970 | Bobeck | 340/174 TF |
| 3,786,447 | 1/1974 | Yamauchi | 340/174 TF |
| 3,810,133 | 5/1974 | Bobeck et al. | 340/174 TF |

*Primary Examiner*—Stanley M. Urynowicz, Jr.
*Attorney, Agent, or Firm*—Lane, Aitken, Dunner & Ziems

[57] ABSTRACT

Parallel "crow-foot" circuit elements in different bubble paths symmetrical about an axis parallel to and between the paths propagate bubbles in opposite directions with the same set of pulsed drive fields and are used to build closed loop paths with parallel sides. Special cornering elements couple parallel channels to form rectangular loops.

18 Claims, 17 Drawing Figures

FIG. 8.
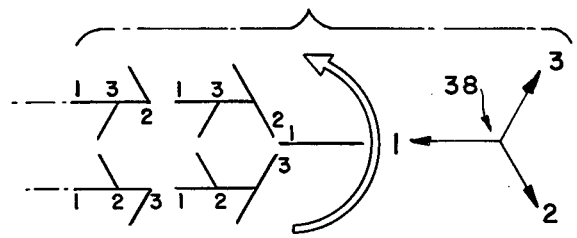
FIG. 9.
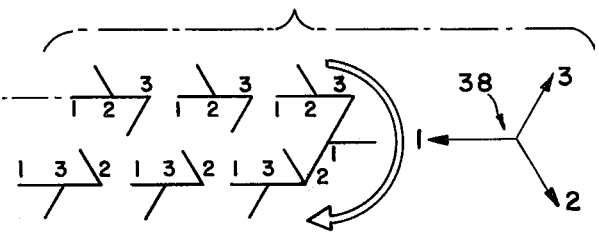
FIG. 10.
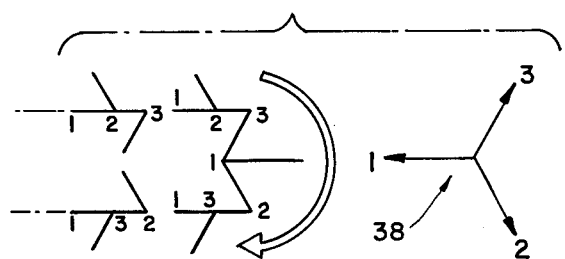
FIG. 11.
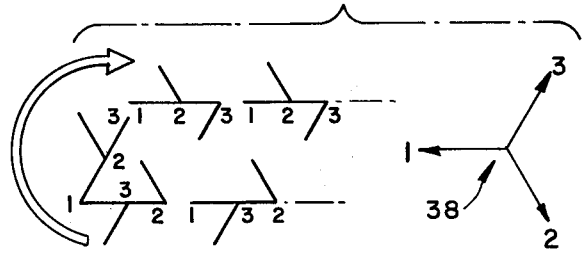
FIG. 12.
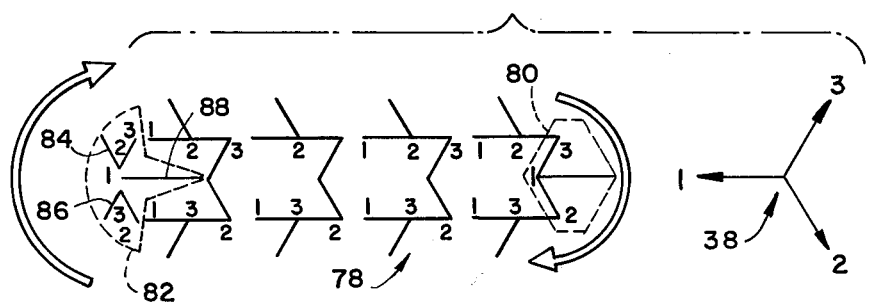
FIG. 13.
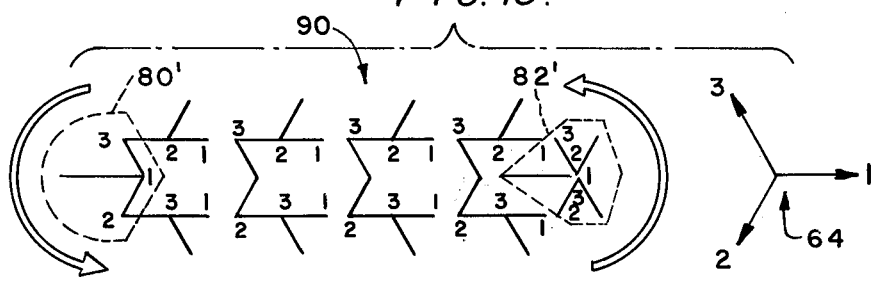
FIG. 14.
FIG. 15.
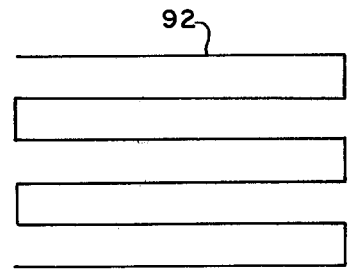
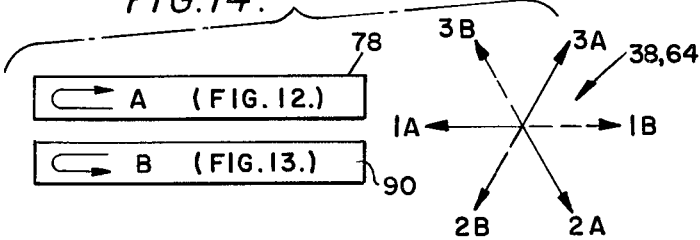

MUTUALLY EXCLUSIVE PARALLEL-SIDED LOOPS

BACKGROUND OF THE INVENTION

The invention relates generally to the field of magnetic bubble technology (MBT) and, more particularly, to means for propagating or transmitting magnetic bubbles, especially in recirculating closed loops.

MBT involves the creation and manipulation of magnetic bubbles in specially prepared magnetic materials. The word "bubble", used throughout this text is intended to encompass any single-walled magnetic domain, defined as a domain having an outer boundary which closes on itself. The application of a static, uniform magnetic bias field orthogonal to a sheet of magnetic material having suitable uniaxial anisotropy causes the normally random serpentine pattern of magnetic domains to shrink into isolated, short cylindrical configurations or bubbles whose common polarity is opposite that of the bias field. The bubbles repell each other and can be moved or propagated by a magnetic field in the plane of the sheet.

Many schemes exist for propagating bubbles along predetermined channels. These techniques can be classed generally as conductor-accessed and field-accessed. In conductor-accessed propagation systems electrically pulsed conductive loops are disposed in series over the magnetic sheet. In field-accessed propagation systems electrical conductors are not disposed on the magnetic sheet for propagation; instead, an overlay pattern of ferromagnetic elements establishes a bubble propagation channel in which a sequence of attracting poles is caused to be formed in the presence of a continuous, uniformly rotating magnetic drive field in the plane of the sheet.

A major distinction in function between conductor-accessed and field-accessed circuits is that several conductor-accessed circuits can be disposed on the same sheet or "bubble chip" and operated completely separately and exclusively from each other while field-accessed circuits on the same chip all operate at the same time under the control of a ubiquitous, uniformly rotating, common drive field.

One attempt at providing field-accessed channel selection is shown in U.S. Pat. No. 3,543,252 to Perneski illustrating several variations on the familiar T-bar circuit to which different permutations of pulsed orthogonal drive fields are applied.

MBT can be used in data processing because magnetic bubbles can be propagated through channels, whether field-accessed or conductor-accessed, at a precisely determined rate so that uniform data streams of bubbles are possible in which the presence or absence of a bubble at a particular position within the stream indicates a binary "1" or "0". Because of its potential for low cost, low power consumption and extremely high bit density, MBT is under active consideration for use in large scale memories of moderate speed. One of the prime design elements of many memory systems utilizing field-accessed magnetic bubbles is the provision of a closed loop bubble path which can be used as a recirculating "shift register". Many memory arrangements of this type employ a plurality of "minor" loops selectively interconnectible with a "major" loop such that bubbles can be transferred between the major and minor loops on command. The ability to propagate bubbles in one or more recirculating loops without operating other loops on the same chip has until recently been confined to systems employing conductor-accessed circuits. Mutually exclusive closed loop field-accessed bubble propagation circuits are disclosed in copending application Ser. No. 432,450, filed Jan. 11, 1974, by Howard H. Aiken, Paul T. Bailey and Robert C. Minnick, entitled "Mutually Exclusive Magnetic Bubble Propagation Circuits". Discrete mutually exclusive circuit elements and systems composed thereof are disclosed in copending application Ser. No. 448,649, filed Mar. 6, 1974, by Paul T. Bailey and L. John Doerr III, entitled "Mutually Exclusive Magnetic Bubble Propagation Circuits With Discrete Elements" now U.S. Pat. No. 3,879,716. Both of the aforementioned copending applications are assigned to the assignee of this application and incorporated herein by reference.

One of the features of the closed loop embodiments disclosed in the aforementioned copending applications is that the sides of each circuit must be parallel to corresponding sides of a reference triangle, preferably equilateral. Consequently, the embodiments therein disclosed did not have the geometry of a rectangle or parallelogram. This feature may be a disadvantage in applications where complex circuit paths become necessary to conserve space on the bubble chip.

SUMMARY OF THE INVENTION

One of the objects of the invention is to provide parallel-sided propagation paths for circuit elements of the mutually exclusive type whereby closed loops having the form of rectangles and parallelograms are possible. Another object of the invention is to propagate bubbles in opposite directions along parallel propagation channels of discrete circuit elements of the mutually exclusive type under the control of the same drive field sequence.

The applicant has discovered that these and other objects of the invention are achieved by arranging two bubble paths in parallel composed of similar discrete overlay circuit elements of the mutually exclusive field-accessed type such that the shape and orientation of the elements in one channel are symmetrical to corresponding elements in the other channel about a parallel axis between the channels. The parallel channels, when driven by the same set of pulsed in-plane drive fields, propagate bubbles in opposite directions. Utilizing this principle of symmetrical parallel channels, closed loops may be formed having at least two parallel sides along which bubbles always propagate in opposite directions, for example, a trapezoid, parallelogram or hexagon. Moreover, by using circuit elements of the mutually exclusive type, parallel-sided closed loops can be exclusively selected by different, corresponding sets of drive fields.

In the preferred embodiments, parallel-sided loops are formed using the "crow-foot" circuit elements disclosed in the aforementioned copending application by Paul T. Bailey and L. John Doerr. In particular, mutually exclusive loops in the form of parallelograms and rectangles are described herein with special 120° and 90° cornering elements, respectively.

BRIEF DESCRIPTION OF THE DRAWINGS

FIGS 7-11 are schematic diagrams illustrating parallel crow-foot channels coupled by different 90° cornering elements, and the associated drive fields.

FIGS. 12 and 13 are schematic diagrams illustrating closed loop rectangular crow-foot paths and the associated drive fields for each.

FIG. 14 is a schematic diagram illustrating the relationship between the drive field sets and propagation directions for the mutually exclusive circuits of FIGS. 12 and 13.

FIG. 15 is a schematic diagram of a serpentine bubble path.

DESCRIPTION OF THE PREFERRED EMBODIMENTS

Figure 1:
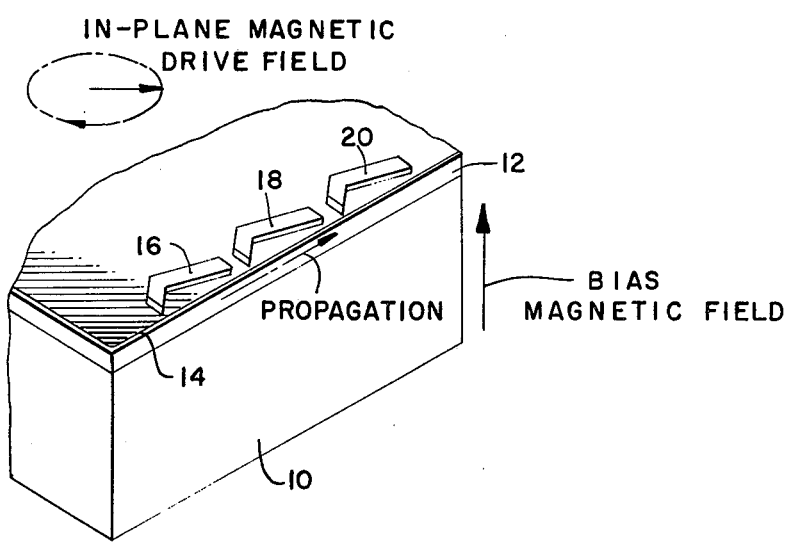
FIG. 1 is a fragmentary perspective view of a bubble chip furnished with a conventional chevron circuit.

FIG. 1 illustrates the basic components of a field-accessed garnet bubble chip having a conventional chevron circuit. A substrate 10 of nonmagnetic garnet supports an epitaxial magnetic bubble garnet layer 12 and spacing layer 14 of silicon oxide to which conventional permalloy chevron circuit elements 16, 18 and 20 are bonded. The chip is subject to a static magnetic bias field orthogonal to the plane of the magnetic bubble garnet layer 12. In the presence of a bias field of suitable strength, cylindrical bubbles (not shown in FIG. 1) are maintained in garnet layer 12. Conventionally, a rotating in-plane magnetic drive field, produced by an orthogonal pair of Helmholtz coils causes bubbles to propagate along chevron circuit element 16 to element 18, for example. Many parameters affect the performance of chevron circuits, such as the number of parallel chevrons per bubble position (single chevrons are illustrated in FIG. 1), the spacing of adjacent chevron elements, their width, the magnetic properties of the overlay material, the propagation rate, and the strength of the bias and drive fields.

If one were concerned only with finding the best field-accessed overlay pattern for use with a uniformly rotating drive field, among those presently available, certainly either chevrons or T-bars would be a good choice. Another kind of overlay circuit element, however, has been discovered to be more particularly suited to the task of circuit discrimination via different pulsed drive field orientations.

The crow-foot element, comprises a straight bar or stem having an arm at one end making an acute angle with the stem and another arm intermediate of the ends of the stem extending at an acute angle on the other side thereof. The angled arms resemble staggered branches or barbs. In the preferred embodiment the angles of the arm relative to the stem are both 60°. Bubbles are transported in the magnetic bubble garnet layer immediately beneath the stem portion by the sequential application of three fields preferably separated by 120°, aligned along the stem and the two angled arms respectively such that attractive bubble positions are formed consecutively at one end of the stem, the middle, and the other end of the stem. Crow-foot elements are arranged serially with the stem portions in alignment to form bubble propagation paths which resemble bird tracks, hence the element's name.

The "complementary" set of three drive fields (in which the orientations are all reversed) will drive a channel of crow-foot elements of "reverse" shape, but is ineffective to propagate bubbles on the "normal" crow-foot channel. Thus channels of crow-foot elements having reverse shapes relative to each other are mutually exclusively field-accessible. The term "mutually exclusive element" as used herein, means any one of at least two kinds of analogous elements, where a channel composed of one kind of elements propagates bubbles by means of a corresponding set of sequential drive field orientations which does not propagate bubbles on a channel composed of the other kind of elements, and vice versa, where both kinds of elements bear the same geometrical relationship to the corresponding sets of field orientations which drive them.

Figure 2:
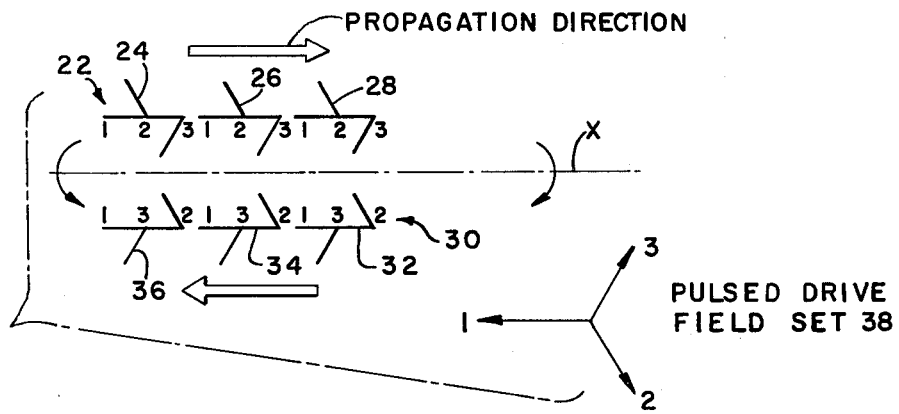
FIG. 2 is a schematic diagram illustrating two opposite parallel crow-foot channels driven by the same pulsed drive field.

In FIG. 2 a crow-foot channel 22 is composed of three serially aligned crow-foot elements 24, 26 and 28. A second crow-foot channel 30 parallel to channel 22 is composed of serially aligned crow-foot elements 32, 34 and 36. The shape and orientation of each crow element in channel 30 are symmetrical to the shape and orientation of each element in channel 22, about a line of symmetry, the x-axis, drawn between and parallel to the two channels 22 and 30.

A set of pulsed drive fields 38 is applied to the two channels to propagate bubbles along the aligned stemmed portions of the elements in each channel. With reference to channel 22, the drive field orientation labeled 1 is parallel to the stem portion of the crow-foot element, field orientation 2 is parallel to the intermediate angled arm and field orientation 3 is parallel to the angled end arm of each crow-foot element. The direction of each field is such that three consecutive attracting magnetic positions are formed along each crow-foot element at one end, at the intersection of the intermediate angled arm and at the other end. Bubbles are propagated along the stem portions of the crow-foot elements 24, 26 and 28 toward the right, as viewed in FIG. 2, through the bubble positions labeled 1, 2 and 3 corresponding to the sequential application of the drive field set 38. In the parallel channel 30 bubbles are propagated in a similar manner through the labeled bubble positions which again correspond to the numbered field sequence 38. However, because of the interchanged arrangement of the angled arms of elements 32, 34 and 36, bubbles propagate to the left in channel 30.

In the aforementioned copending application by Bailey and Doerr, triangular, closed loop crow-foot circuits were described. In the preferred embodiments adjacent sides of of the closed loop path are joined by 60° angles using special cornering elements.

Figure 3:
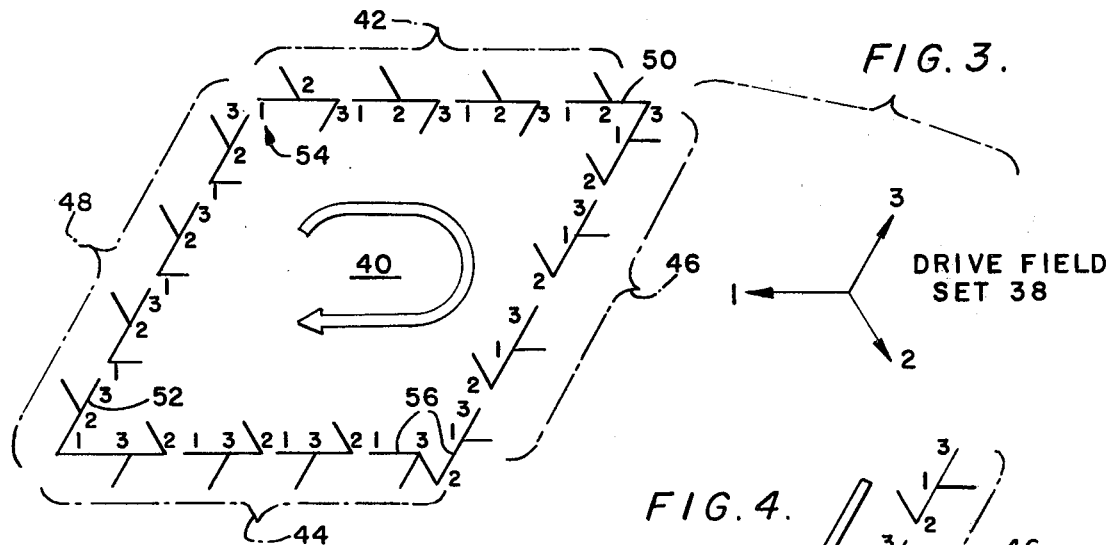
FIG. 3 is a schematic diagram illustrating a closed loop bubble path having opposite parallel sides composed of crow-foot circuit elements, and the associated set of sequential drive fields.

The principle described in FIG. 2 of the present application can be used in building closed loop circuits having at least two parallel, opposite, propagating sides. A parallelogram, crow-foot, closed loop circuit 40 is shown in FIG. 3. The circuit is composed of two pairs of parallel sides 42, 44 and 46, 48. The elements which make up corresponding sides 44 and 46 correspond to the channels 22 and 30 in FIG. 2. The elements making up the sides 46 and 48 also bear the same reflection relationship to each other as that in FIG. 2. The parallelogram circuit 40 contains four corners at two 60° angles and two 120° angles. The two 60° corners are formed by cornering elements 50 and 52 which are further described in the aforementioned, copending application by Bailey and Doerr. One of the, 120° angles, corner 54, is accomplished by means of mere juxtaposition of two crow-foot elements belonging respectively to sides 42 and 48 in the case. The special cornering element 56 for the remaining 120° corner is a composite of a whole crow-foot element belonging to side 46 and a half stem with the intermediate angled arm of another crow-foot element belonging to side 44. The half element from side 44 is joined at its vertex to the free end of the angled end arm of the whole crow-foot element belonging to side 46. The operation of the parallelogram circuit 40 by drive field sequence 38 is indicated by the correspondingly labeled bubble positions throughout the circuit 40.

Figure 4:
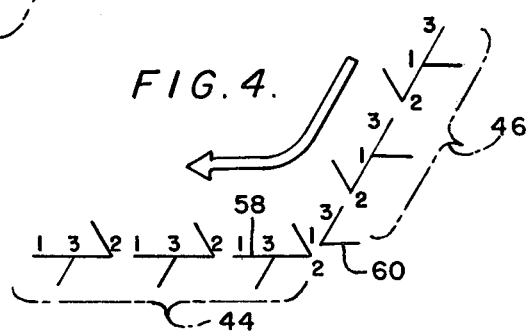
FIG. 4 is a schematic diagram illustrating an alternative 120° cornering arrangement for the circuit of FIG. 3.

FIG. 4 illustrates a variation on the special 120° cornering element between sides 44 and 46 of the parallelogram circuit 40 of FIG. 3. In FIG. 4 the right-hand member of the lower side 44 is a whole crow-foot element 58 and the adjacent member of the right side 46 is a half element 60 separated by a gap from the whole element 58. The half element 60 comprises a half stem with the joined intermediate angled arm. The vertex of element 60 is juxtaposed, but not joined with the right-hand end of the whole crow-foot element 58. The operation of the 120° corner is indicated by the labeled bubble positions corresponding to the numbered drive field sequence in FIG. 3

Figure 5:
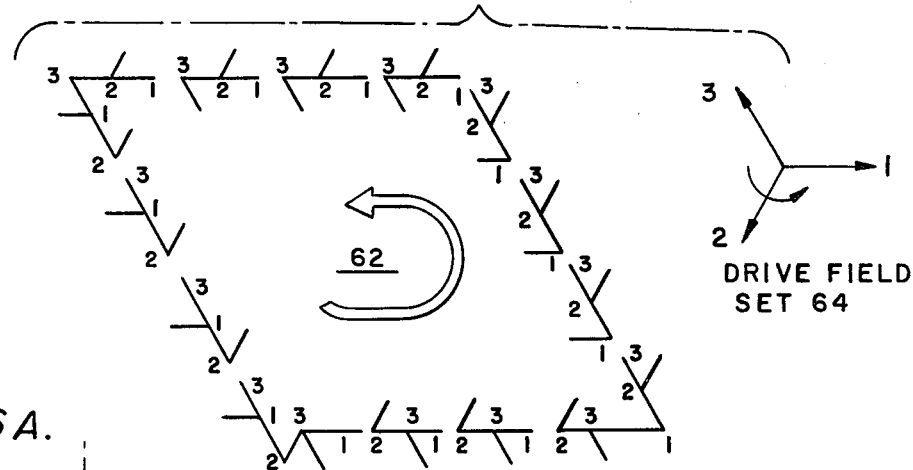
FIG. 5 is a schematic diagram illustrating a parallelogram crow-foot circuit, mutually exclusive from the circuit of FIG. 3, and drive fields therefor.

FIG. 5 is another crow-foot parallelogram circuit 62 with analogous cornering elements to the circuit 40 of FIG. 3 Circuit 62 is driven by drive field sequence 64 as indicated by the correspondingly numbered consecutive bubble positions.

Figure 6A:
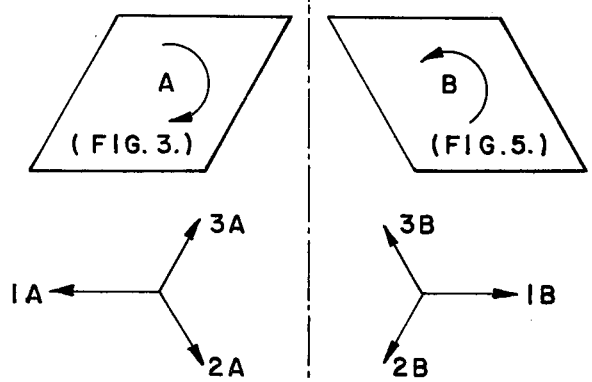
FIG. 6A is a schematic diagram illustrating the relationship of the drive field sets and propagation directions for the mutually exclusive circuits in FIGS. 3 and 5.

In FIG. 6A, the interrelationship between circuits 40 (FIG. 3) and 62 (FIG. 5) is illustrated. The circuit of FIG. 3 is designated circuit A and is driven by drive field sequence 1A, 2A, and 3A. Similarly, the circuit 62 of FIG. 5 is designated circuit B and is driven by field sequence 1B, 2B and 3B. The patterns of elements as well as the individual elements in circuits 40 and 62, respectively, are symmetrical in shape and orientation about the vertical y-axis. It should be noted that the y-axis is perpendicular to one segment of each crow-foot element on each side of circuits 40 and 62. For example, the stems of the elements comprising side 42 of circuit 40 are perpendicular to the y-axis. Because in the preferred embodiment the arms make 60° angles with the stem of the crow-foot element, the y-axis cannot be parallel to any segment of any element of the circuits 40 and 62 (A and B). In contrast, the x-axis of FIG. 2 is parallel to one segment of each element, in this case the stem. Moreover, the A and B drive field sets (38 and 64) are also symmetrical about the y-axis. The B field sequence is opposite from the A field sequence in that the orientation of the B vectors are 180° with respect to corresponding ones of the A vectors, as seen more clearly in FIG. 6B. The A fields are not effective to propagate bubbles around the B circuit and B fields are not effective to drive bubbles around the A circuit. Hence, the parallel-sided, field-accessed closed loop circuits, A, B are mutually exclusive. Thus by choosing the axis of symmetry between the separate circuits as a line (the y-axis) perpendicular to segments of the crow-foot elements, mutually exclusive circuits are provided, while choosing the axis of symmetry within each circuit as a line parallel to segments of the crow-foot elements provides parallel paths which propagate in opposite directions in the same field sequence. This latter principle is, of course, the one which enables construction of parallel sided closed loops.

It should also be noted that if the rotational order of either field sequence A or B in FIG. 6A were reversed, the corresponding circuit would propagate in the opposite direction.

Figure 7:
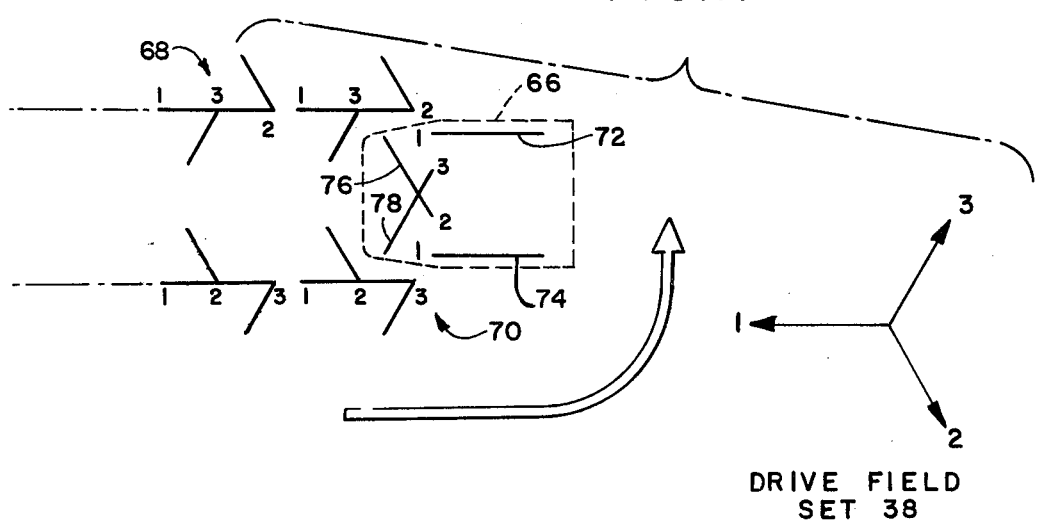

FIG. 7 illustrates one form of 90° cornering element 66 joining parallel commonly driven crow-foot channels 68 and 70. Cornering element 66 comprises a pair of parallel bars 72 and 74 extending to the right of the channels 68 and 70. Two angled bar elements are combined to form an x-shaped element 76 whose end are aligned between the left-hand ends of the bar elements 72 and 74. The Operation of cornering element 66 is indicated by the labeled bubble positions corresponding to the numbered standard drive field sequence 38.

FIGS. 8–11 include other types of 90° cornering elements useful in linking two parallel channels. The operation of each of these cornering elements is indicated by the bubble positions which are labeled in accordance with the numbered drive field sequence 38.

In FIG. 12 a closed loop rectangular circuit 78 is composed of parallel opposite crow-foot channels driven by drive field sequence 38. The opposite ends of the channel are coupled by means of different cornering elements 80 and 82. Cornering element 80 is the same as that shown in FIG. 10. Cornering element 82 includes two angled elements 84 and 86 whose vertices are aligned with the left-hand end of a bar 88 parallel to the crow-foot channels. Again, the operation of circuit 78 is indicated by the numbered bubble positions corresponding to the numbered drive field sequence 38. Corresponding ones of parallel opposite crow-foot elements in the parallel channels are joined in parts by connecting the ends of the corresponding angled arms together. This latter feature is facilitated by the 90° cornering elements.

FIG. 13 shows a rectangular, closed loop crow-foot circuit 90 which is mutually exclusive to the circuit 78 of FIG. 12. The circuit 90 is driven by the drive field sequence 64, and the relative locations of the cornering elements 80' and 82' are reversed with respect to the arrangement in FIG. 12, as well as the shape of the elements making up the parallel channels.

Figure 6B:
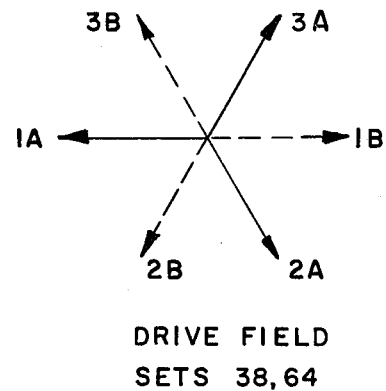
FIG. 6B is a schematic diagram further illustrating the relationship of the drive field sets in FIG. 6A.

FIG. 14 illustrates the relationship between the drive fields for the circuits 78 and 90. The same convention as in FIGS. 6A and 6B are observed for distinguishing the drive field sequence exclusively associated with either circuit. Thus, two rectangular loops can be mutually exclusively field-accessed by using the parallel channel technique of the invention.

Although the preferred embodiments have involved crow-foot circuit elements, the underlying principle of the invention is applicable to any other discrete mutually exclusive circuit elements of the mutually exclusive type. While pulsed field sequences have been illustrated in connection with the preferred embodiments, crow-foot circuit elements may also be driven by uniformly rotating fields. Besides closed loops, those familiar with the art will recognize that the invention also enables parallel-sided, "back and forth" shift registers having parallel serpentine configurations as indicated by circuit 92 in FIG. 15.

Figure 16:
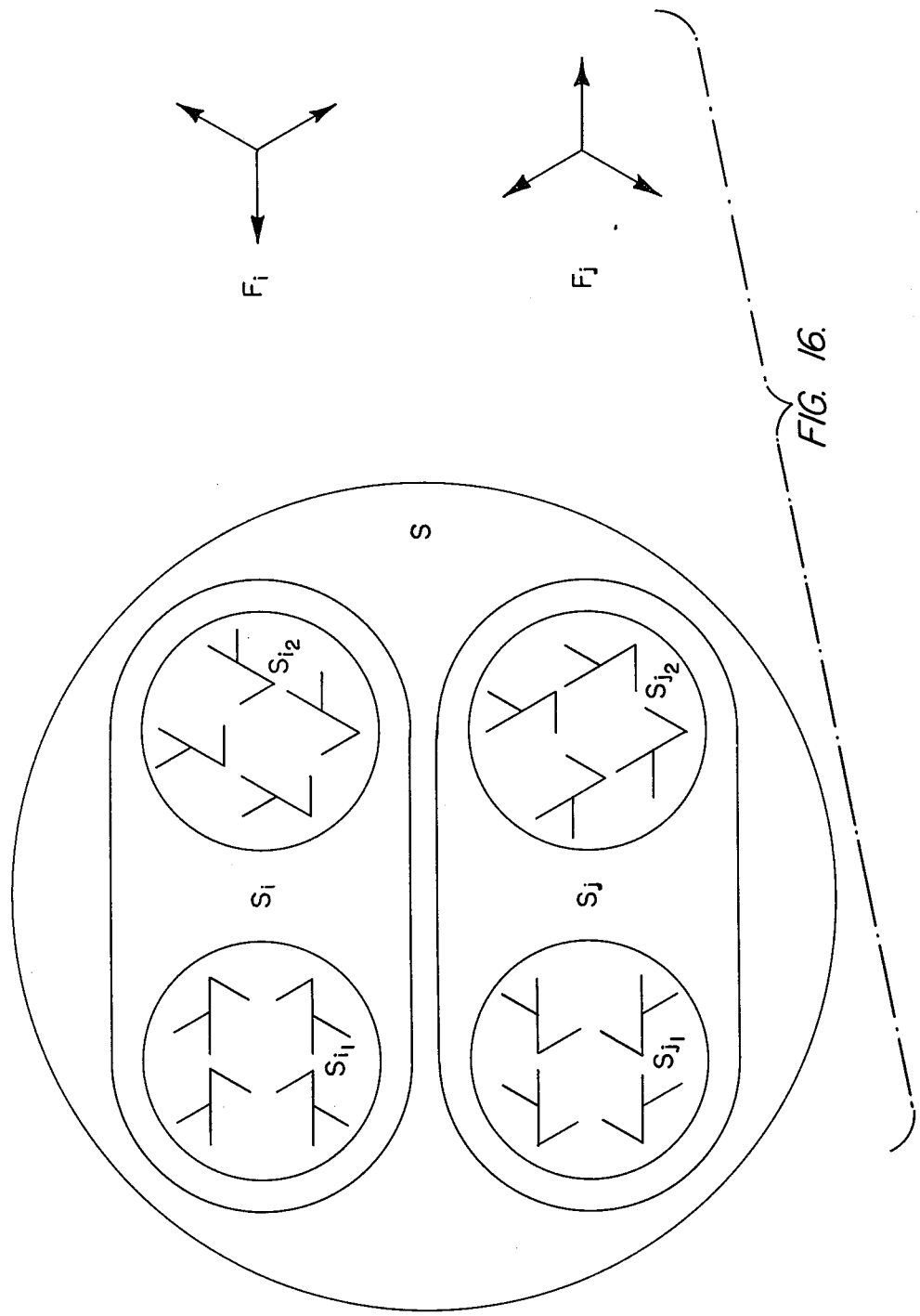
FIG. 16 is a schematic diagram illustrating the definition of "mutually exclusive element" as applied to the set of crow-foot elements.

The significance of the definition of "mutually exclusive element" appearing immediately prior to the discussion of FIG. 2 above is illustrated in FIG. 16. S is a particular set (the crow-foot set) of field-accessed, overlay circuit elements having two subsets $S_i$ and $S_j$ each composed of geometrically analogous elements. The subset $S_i$ may have, for example, two subsubsets $S_{i_1}$ and $S_{i_2}$ (so grouped because they propagate in parallel) each composed of elements which propagate simultaneously in opposite directions. The subset $S_j$ may have similar subsubsets. All of the elements of $S_i$ are distinguished collectively from all of the elements of $S_j$ only by the fact that there exists an in-plane drive field system $F_i$ which causes bubbles to advance along paths defined by elements of $S_i$ without causing bubbles to advance along paths defined by elements of $S_j$ and there exists another in-plane drive field system $F_j$ which causes bubbles to advance along paths defined by the elements of $S_j$ without causing bubbles to advance along paths defined by the elements of $S_i$. Thus, it is said that elements in subsubset $S_{i_2}$ are "mutually exclusive circuit elements", in that they belong to the set $S_i$ which is mutually exclusive from $S_j$, even though all elements in $S_{i_2}$ propagate simultaneously under the same drive field $F_i$.

The invention may be embodied in other specific forms without departing from its spirit or characteristic. The present embodiments are therefore to be considered in all respects as illustrative and not restrictive, the scope of the invention being indicated by the claims rather than by the foregoing description, and all changes which come within the meaning and range of equivalence of the claims are therefore intended to be embraced therein.

I claim:

1. A field-accessed bubble propagation system, comprising a sheet of magnetic bubble material, means for producing and maintaining bubbles therein, a ferromagnetic overlay pattern operatively disposed on said sheet including a first bubble path composed of discrete mutually exclusive circuit elements and a second bubble path parallel to said first path composed of discrete mutually exclusive circuit elements whose shape and orientation are symmetrical to the elements in said first path with respect to a symmetry line between and parallel to said first and second paths, and means for applying a magnetic drive field in the plane of said sheet to propagate bubbles simultaneously in opposite directions along said first and second paths, said discrete mutually exclusive circuit elements each being in the form of a stem aligned with the direction of propation having an angled arm at one end and another angled arm on the other side of said stem intermediate of the ends of said stem, said angled arms being like staggered branches projecting from said stem.

2. The propagation system of claim 1, wherein said means for applying a magnetic drive field includes means for applying a sequence of three discrete pulsed drive field orientations aligned respectively with said stem and angled arms such that attracting magnetic poles are formed along said stem consecutively at one end, at the junction of the intermediate angled arm and the stem, and at the other end of said stem.

3. The propagation system of claim 2, wherein consecutive ones of said three drive field orientations are separated by approximately 120°.

4. A field-accessed bubble propagation system, comprising a sheet of magnetic bubble material, means for producing and maintaining bubbles therein, a ferromagnetic over-lay pattern operatively disposed on said sheet including first and second parallel bubble paths composed respectively of different discrete mutually exclusive circuit elements, said respective mutually exclusive circuit elements belonging to the same subset of first set of field accessed elements composed of at least two subsets $S_i$ and $S_j$, each composed of elements designed with respect to elements in the other subset such that the respective members of $S_i$ and $S_j$ are distinguished collectively from each other only by the fact that there exists an in-plane dirve field system $F_i$ which propagates bubbles on each species of elements in $S_i$ without causing bubble propagation on any element in $S_j$ and there exists another in-plane drive field system $F_j$ which propagates bubbles on each species of element in $S_j$ without causing bubble propagation on any element in $S_i$, the shape and orientation of said elements of said second path being symmetrical to the shape and orientation of said elements in said first path with respect to a symmetry line between and parallel to said first and second paths, said overlay pattern further including a third bubble path including a discrete mutually exclusive circuit element belonging to a subset of a second set arranged to transfer bubbles on said first path to said second path, and means for applying a magnetic drive field associated with said same subset of said first set and said subset of said second set in the plane of said sheet to propagate bubbles simultaneously in opposite directions along said first and second paths and also therebetween on said third path, said drive field applying means including means for generating a set of sequential discrete field orientations to which said first, second and third paths are simultaneously responsive to propagate bubbles.

5. The propagation system of claim 4, wherein said set consists of three field orientations, approximately equally separated.

6. The propagation system of claim 5, wherein said element of said third path is in a form like an arrow pointing in the direction of propagation of the path to which bubbles are transferred, said arrow-like form being composed of a V-shaped portion and a bar-shaped portion joined at one end to the vertex of said V-shaped portion being operatively coupled respectively to the ends of elements in said first and second paths respectively, said bar-shaped portion being parallel to one of said three field orientations, and said V-shaped portion being parallel respectively to the other two field orientations.

7. The propagation system of claim 5, wherein said element of said third path includes a bar parallel to one of said three field orientations and a pair of V-shaped elements with their vertices juxtaposed on opposite sides of the end of said bar that points in the direction of propagation on the path from which bubbles are transferred, said V-shaped elements pointing in opposite directions transverse to said bar, corresponding portions of said V-shaped elements being parallel respectively to said other two field orientations, each of said V-shaped elements having one end operatively coupled with the ends of respective elements of said first and second paths.

8. A field-accessed bubble propagation circuit comprising a sheet of magnetic bubble material, means for producing and maintaining bubbles therein, a ferromagnetic overlay pattern operatively disposed on said sheet including a closed loop bubble path composed of discrete mutually exclusive circuit elements, said mutually exclusive circuit elements belonging to the same subset of a set of field accessed elements composed of at least two subsets $S_i$ and $S_j$, each composed of elements designed with respect to elements in the other subset such that the respective members of $S_i$ and $S_j$ are distinguished collectively from each other only by the fact that there exists an in-plane drive field system $F_i$ which propagates bubbles on each species of elements in $S_i$ without causing bubble propagation on any element in $S_j$ and there exists another in-plane drive field system $F_j$ which propagates bubbles on each species of element in $S_j$ without causing bubble propagation on any element in $S_i$, said path having two parallel sides which propagate bubbles in opposite directions on respective circuit elements which are different but belong to said same subset, and means for applying a magnetic drive field associated with said same subset in the plane of said sheet to circulate bubbles in said closed loop, said means for applying a magnetic drive field including means for applying a sequence of discrete pulsed drive field orientations to which the circuit elements in said parallel sides are simultaneously responsive to propagate bubbles around said closed loop.

9. The circuit of claim 8, wherein consecutive ones of said pulsed drive field orientations are separated by approximately 120°.

10. The circuit of claim 9, wherein said mutually exclusive discrete circuit elements are each in the form of a elongated stem parallel to the local direction of propagation and having an angled arm on one end and another angled arm intermediate of the ends of said stem, said arms being arranged in the form of staggered branches projecting from said stem.

11. The circuit of claim 10, wherein said means for applying a magnetic drive field includes means for applying a sequence of three discrete pulsed drive field orientations aligned respectively with said stem and said angled arm such that attracting magnetic poles are formed at one end of said stem, at the junction of said intermediate arm with said stem, and at the other end of said stem.

12. The circuit of claim 11, wherein said closed loop bubble path is in the form of a parallelogram.

13. The circuit of claim 11, wherein said closed propagation path is rectangular.

14. The circuit of claim 13, wherein first and second paths defined by said two sides are joined by cornering elements magnetically responsive to said three discrete pulsed field orientations for transferring bubbles from said first path to said second path.

15. The circuit of claim 14, wherein at least one of said cornering elements is in a form like an arrow pointing in the direction of propagation of the path to which bubbles are transferred, said arrow-like form being composed of a V-shaped portion and a bar-shaped portion joined at one end to the vertex of said V-shaped portion, the ends of said V-shaped portion being joined respectively to the ends of elements in said first and second paths respectively, said bar-shaped portion being parallel to said first and second paths and the V-shaped portion being parallel respectively to said angled arms.

16. The circuit of claim 14, wherein at least one of said cornering elements includes a bar parallel to said first and second paths and a pair of V-shaped elements with their vertices juxtaposed on opposite sides of the end of said bar that points in the direction of propagation on the path from which bubbles are transferred, said V-shaped elements pointing in opposite directions transverse to said first and second paths, said V-shaped elements being parallel respectively to said angled arms, each of said V-shaped elements having one end juxtaposed with the ends of respective elements in said first and second paths.

17. A field-accessed bubble propagation system, comprising a sheet of magnetic bubble material, means for producing and maintaining bubbles therein, a ferromagnetic overlay pattern operatively disposed on said sheet including a first bubble path composed of discrete, mutually exclusive circuit elements, said mutually exclusive circuit elements belonging to a subset of a set of field accessed elements composed of at least two subsets $S_i$ and $S_j$, each composed of elements designed with respect to elements in the other subset such that the respective members of $S_i$ and $S_j$ are distinguished collectively from each other only by the fact that there exists an in-plane drive field system $F_i$ which propagates bubbles on each species of elements in $S_i$ without causing bubble propagation on any element in $S_j$ and there exists another in-plane drive field system $F_j$ which propagates bubbles on each species of element in $S_j$ without causing bubble propagation on any element in $S_i$, and a second bubble path parallel to said first path composed of discrete mutually exclusive circuit elements different from those of said first path but belonging to the same subset as those of said first path, whose shape and orientation are symmetrical to the elements in said first with respect to a symmetry line between and parallel to said first and second paths, and for means applying a magnetic drive field associated with said same subset in the plane of said sheet to propagate bubbles simultaneously in opposite directions along said first and second paths, said means for applying a magnetic drive field including means for applying a predetermined set of sequential pulsed discrete drive field orientations to which the elements in said first and second paths are simultaneously responsive to propagate bubbles.

18. The propagation system of claim 17, wherein consecutive ones of said discrete drive field orientations are separated by approximately 120°.

* * * * *